(12) United States Patent
Baldwin et al.

(10) Patent No.: US 9,748,376 B2
(45) Date of Patent: Aug. 29, 2017

(54) POWER FET WITH INTEGRATED SENSORS AND METHOD OF MANUFACTURING

(71) Applicant: Texas Instruments Incorporated, Dallas, TX (US)

(72) Inventors: David J Baldwin, Allen, TX (US); Gary Eugene Daum, Orwigsburg, PA (US); Simon John Molloy, Allentown, PA (US); Abidur Rahman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/248,521

(22) Filed: Aug. 26, 2016

(65) Prior Publication Data

US 2017/0179278 A1   Jun. 22, 2017

Related U.S. Application Data

(60) Provisional application No. 62/270,359, filed on Dec. 21, 2015, provisional application No. 62/294,483, filed on Feb. 12, 2016.

(51) Int. Cl.
*H01L 29/10* (2006.01)
*H01L 29/78* (2006.01)
(Continued)

(52) U.S. Cl.
CPC ...... *H01L 29/7815* (2013.01); *H01L 21/2253* (2013.01); *H01L 21/763* (2013.01);
(Continued)

(58) Field of Classification Search
None
See application file for complete search history.

(56) References Cited

U.S. PATENT DOCUMENTS

2007/0064369 A1* 3/2007 Devarajan ............ H03K 17/08
  361/103
2009/0140763 A1* 6/2009 Kim ...................... H01L 22/14
  324/762.05

(Continued)

OTHER PUBLICATIONS

Xiao et. al. "Current sensing trench power MOSFET for automotive applications", Applied Power Electronics Conference and Exposition, 2005. APEC 2005. Twentieth Annual IEEE, Mar. 6-10, 2005, ISBN: 0/7803-8975-1, 0/7803-8975-1.*

*Primary Examiner* — Sitaramarao S Yechuri
(74) *Attorney, Agent, or Firm* — Lawrence J. Bassuk; Charles A. Brill; Frank D. Cimino

(57) ABSTRACT

A semiconductor device and a method of making are disclosed. The device includes a substrate, a power field effect transistor (FET), and integrated sensors including a current sensor, a high current fault sensor, and a temperature sensor. The structure of the power FET includes a drain contact region of a first conductivity type disposed in the substrate, a drain drift region of the first conductivity type disposed over the drain contact region, doped polysilicon trenches disposed in the drain drift region, a body region of a second conductivity type, opposite from the first conductivity type, disposed between the doped polysilicon trenches, a source region disposed on a lateral side of the doped polysilicon trenches and in contact with the body region, and a source contact trench that makes contact with the source region and with the doped polysilicon trenches.

16 Claims, 9 Drawing Sheets

(51) Int. Cl.
*H01L 27/02* (2006.01)
*H01L 29/66* (2006.01)
*H01L 21/225* (2006.01)
*H01L 21/762* (2006.01)
*H01L 21/763* (2006.01)
*H01L 29/08* (2006.01)

(52) U.S. Cl.
CPC .... *H01L 21/76224* (2013.01); *H01L 27/0266* (2013.01); *H01L 29/086* (2013.01); *H01L 29/0878* (2013.01); *H01L 29/1095* (2013.01); *H01L 29/66719* (2013.01); *H01L 29/7811* (2013.01)

(56) References Cited

U.S. PATENT DOCUMENTS

2012/0068262 A1\* 3/2012 Pan .................. H01L 29/66734
257/332
2016/0056138 A1\* 2/2016 Shibib ................ H01L 29/7815
257/48

\* cited by examiner

POWER FET WITH INTEGRATED SENSORS AND METHOD OF MANUFACTURING

CLAIM OF PRIORITY AND RELATED PATENT APPLICATIONS

This nonprovisional application claims priority based upon the following prior U.S. provisional patent application(s): (i) "ENABLING TEMPERATURE, CURRENT MONITORING ALONG WITH CURRENT SENSING INTEGRATION WITHOUT ADDING ANY MORE COMPONENTS OTHER THAN INTRINSIC FET ITSELF IN EXTREMELY LOW MID-RANGE VOLTAGE POWER FET TECHNOLOGY WITH COMMON DRAIN DUAL SOURCE STRUCTURE," Application No. 62/270,359, filed Dec. 21, 2015; and (ii) "ENABLING TEMPERATURE, CURRENT MONITORING ALONG WITH CURRENT SENSING INTEGRATION WITHOUT ADDING ANY MORE COMPONENTS OTHER THAN INTRINSIC FET ITSELF IN EXTREMELY LOW MID-RANGE VOLTAGE POWER FET TECHNOLOGY WITH COMMON DRAIN DUAL SOURCE STRUCTURE," Application No. 62/294,483, filed Feb. 12, 2016; both applications filed in the name(s) of David J. Baldwin, Gary Eugene Daum, Simon John Molloy and Abidur Rahman, which are hereby incorporated by reference in their entirety.

FIELD OF THE DISCLOSURE

Disclosed embodiments relate generally to the field of power devices. More particularly, and not by way of any limitation, the present disclosure is directed to a power Field Effect Transistor (FET) with integrated sensors and a method of manufacturing.

BACKGROUND

Power FETs are used to control the power supply to a load, which in one example may be various lights and controls in an automobile, and are designed to run in a given voltage and current range. It is desirable to be able to monitor various conditions on the FET that may cause the device to malfunction or to be damaged. Preferably, these conditions can be monitored without adding to the cost of the device or consuming large amounts of valuable real estate on the device.

SUMMARY

Disclosed embodiments implement a power FET that utilizes a vertical structure to achieve both low drain resistance and a high breakdown voltage. Temperature sensing, highly accurate current sensing and high current fault sensing are all accomplished with integrated sensors that use variations on the basic FET structure, allowing these sensors to be integrated without adding steps to the process or requiring additional masks.

In one aspect, an embodiment of a semiconductor device is disclosed. The semiconductor device includes a substrate comprising a semiconductor; a power field effect transistor (FET); an integrated sense FET that measures a first current that is proportional to a load current on said FET; an integrated high current fault sensor that measures a voltage across a drain of said power FET; and an integrated temperature sensor that measures a voltage that is proportional to a temperature of said power FET; wherein said power FET has a first structure that comprises: a drain contact region of a first conductivity type disposed in said substrate; a drain drift region of said first conductivity type disposed over said drain contact region; doped polysilicon trenches disposed in said drain drift region; a body region of a second conductivity type, opposite from said first conductivity type, disposed between said doped polysilicon trenches; a source region disposed on a lateral side of said doped polysilicon trenches and in contact with said body region; and a source contact trench that makes contact with said source region and with said doped polysilicon trenches.

In another aspect, an embodiment of a method of forming a semiconductor device is disclosed. The method includes defining, on a semiconductor substrate, a power field effect transistor (FET) region, a sense FET region, a temperature sensor region, and a high current fault sensor region; forming a drain contact region of a first conductivity type in the semiconductor substrate and forming a drift region of said first conductivity type overlying said drain contact region; forming deep trench doped polysilicon regions in said drift region; forming body regions in all regions except said high current fault region, said body regions lying between said deep trench doped polysilicon regions; forming gates overlying said body regions; forming sidewall spacers on said gates; forming source regions of said first conductivity type between respective gates and deep trench doped polysilicon regions; and forming source contact trenches that are in contact with said source regions and with a polysilicon layer in said deep trench doped polysilicon regions and depositing metallization layers on a surface of said semiconductor device, wherein a gate and a source in said temperature sensor region are shorted together and further wherein a gate and a drain in said high current fault sensor region are shorted together.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1A:
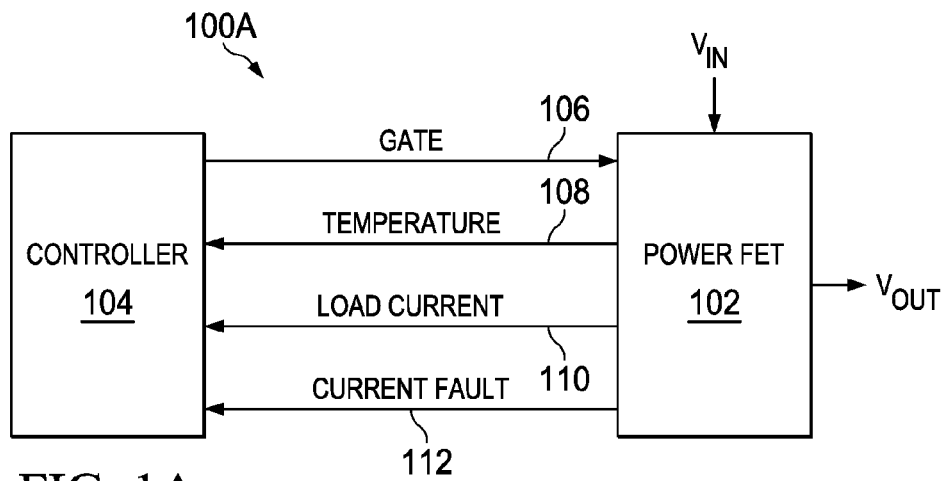
FIG. 1A depicts an example schematic of a power FET and associated controller according to an embodiment of the disclosure.

Referring to FIG. 1A, system 100A is shown, which provides controlled power to a load (not specifically shown). Power FET 102 is a switch that controls a power supply, receiving $V_{IN}$ and providing $V_{OUT}$. Power FET 102 is intended to work in an environment in which the load current may vary within a range from about 100 milliamps to about 15 amps and an initial inrush current can go as high as 90 amps. Higher currents, in the range of 200-300 amps, can indicate a fault condition in which power FET 102 should be shut down. To manage the wide range of load currents, controller 104 needs very accurate information regarding the current through power FET 102. A sensor capable of accurately measuring this wide range of current may not be able to detect the even higher fault conditions. Additionally, due to the high inrush current, the temperature on power FET 102 can rise very quickly. It is necessary to monitor this temperature on-chip to avoid exceed a safe operating temperature.

Controller 104 is responsible both for managing the response of power FET 102 to changing load conditions and also for monitoring the fault conditions that may cause power FET 102 to fail or to be damaged, such as the aforementioned high temperatures and a high current fault condition. Controller 104 is connected to receive sensor input from power FET 102 and also to control the gate of power FET 102 using gate signal 106. In this embodiment, controller 104 receives signals for temperature 108, load current 110 and current fault conditions 112.

Figure 1B:
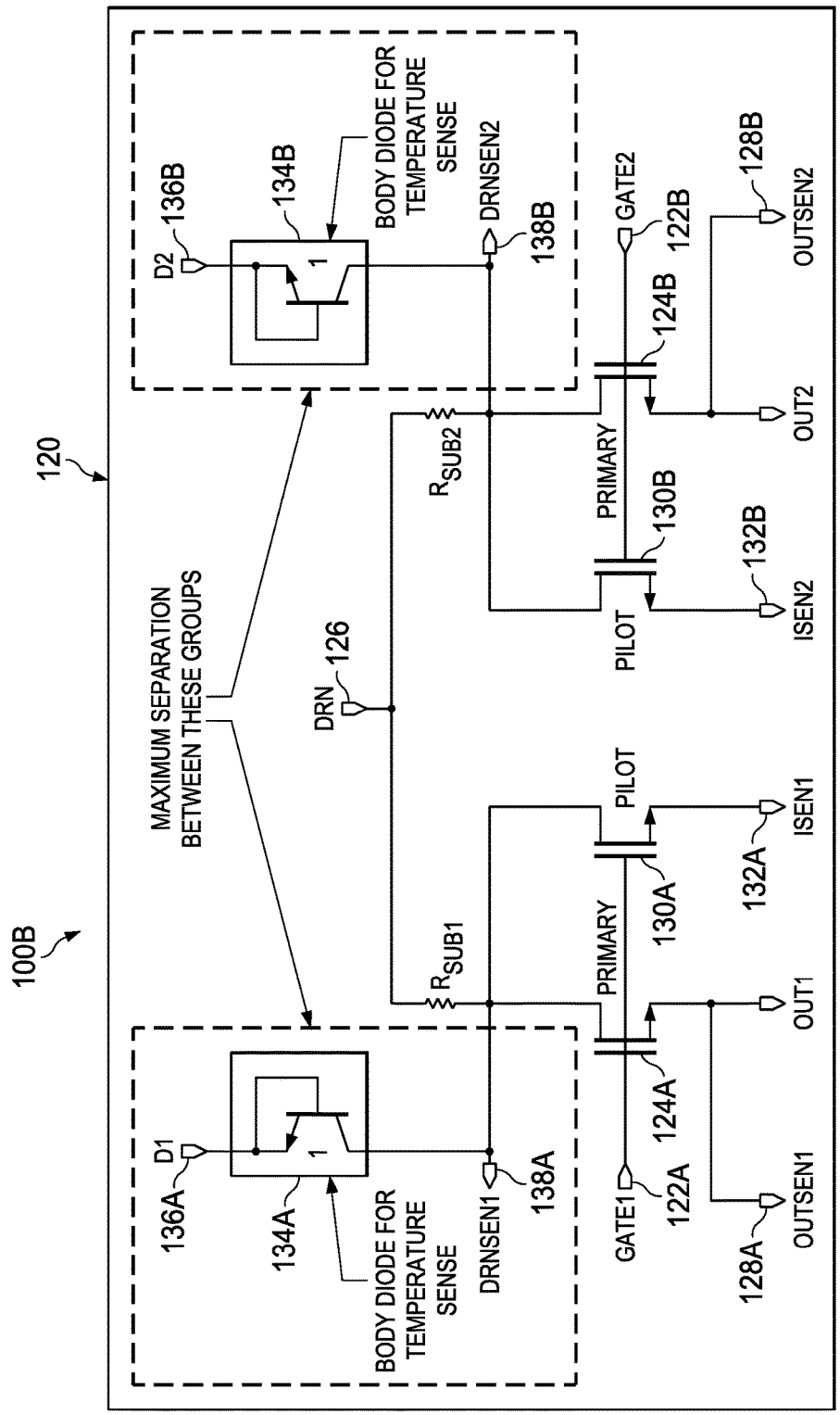
FIG. 1B depicts an example schematic of a dual channel, common drain power FET according to an embodiment of the disclosure.

FIG. 1B illustrates a schematic of circuit 100B, which in this embodiment is a dual channel, common drain power FET, e.g. two power FETs side-by-side on a single chip 120. Gate contact pads 122A, 122B control the gates of both primary FETs 124A, 124B, which receive $V_{IN}$ on drain pads DRN 126 and provide $V_{OUT}$ on respective source pads OUTSEN$_X$ 128A, 128B, and of pilot FET 130A, 130B, which provide an accurate measurement of the load current through each respective FET on corresponding pads ISEN$_X$ 132A, 132B. Temperature sensors 134A, 134B are each built as a FET, but have source and gate shorted to each other; the intrinsic body diode which is formed in all FETs, is then used as a temperature sensor to provide temperature data on pad D$_X$ 136A, 136B. The voltage across the substrate of power FET 102 is measured at pads DRNSEN$_X$ 138A, 138B and used for high current fault detection.

Figure 2A:
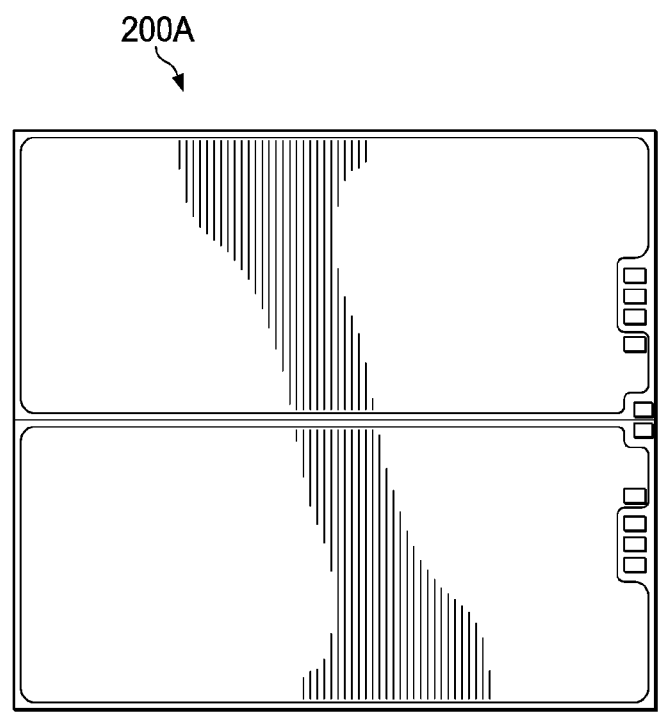
FIG. 2A depicts a semiconductor chip containing the dual channel, common drain FET of FIG. 1B.
Figure 2B:
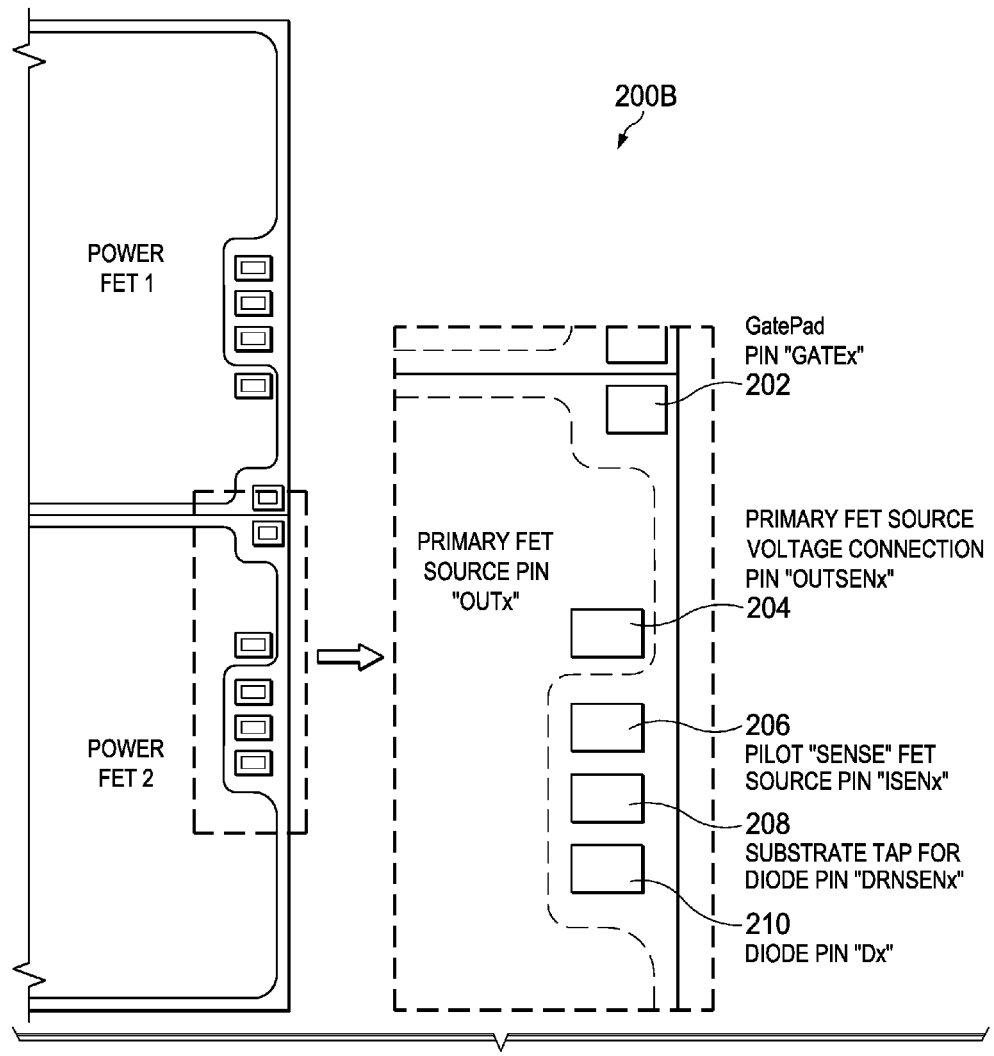
FIG. 2B depicts a close-up of one edge of the semiconductor chip of FIG. 2A and a schematic identifying the elements along the edge of the lower FET.

FIG. 2A shows a top view of chip 200A, which includes two metal oxide silicon FETs (MOSFETs) and their respective pins. It will be recognized by one skilled in the art that the name MOSFET is used to include technologies that may utilize conductors other than metal, dielectrics other than oxide and semiconductors other than doped silicon, but which follow the same general principles. FIG. 2B shows an enlargement of the right-hand side of this chip and a schematic explaining the pins shown thereon for the lower power FET. In these figures, power FET1 occupies the upper half of chip 200A and power FET2 occupies the lower half of chip 200A. The schematic on the right side of FIG. 2B illustrates the contact pads for power FET2, which are the mirror image of the contact pads for power FET1. In this schematic it can be seen that gate pad pin 202 is nearest the boundary between FET1 and FET2; source pin 204 is next in line, followed by the ISEN$_X$ pin 206 from the pilot FET, DRNSEN$_X$ 208 for use with high current fault detection and temperature-sensing pin D$_X$ 210. It will be understood that other arrangements of these pins may also be used.

Figure 3:
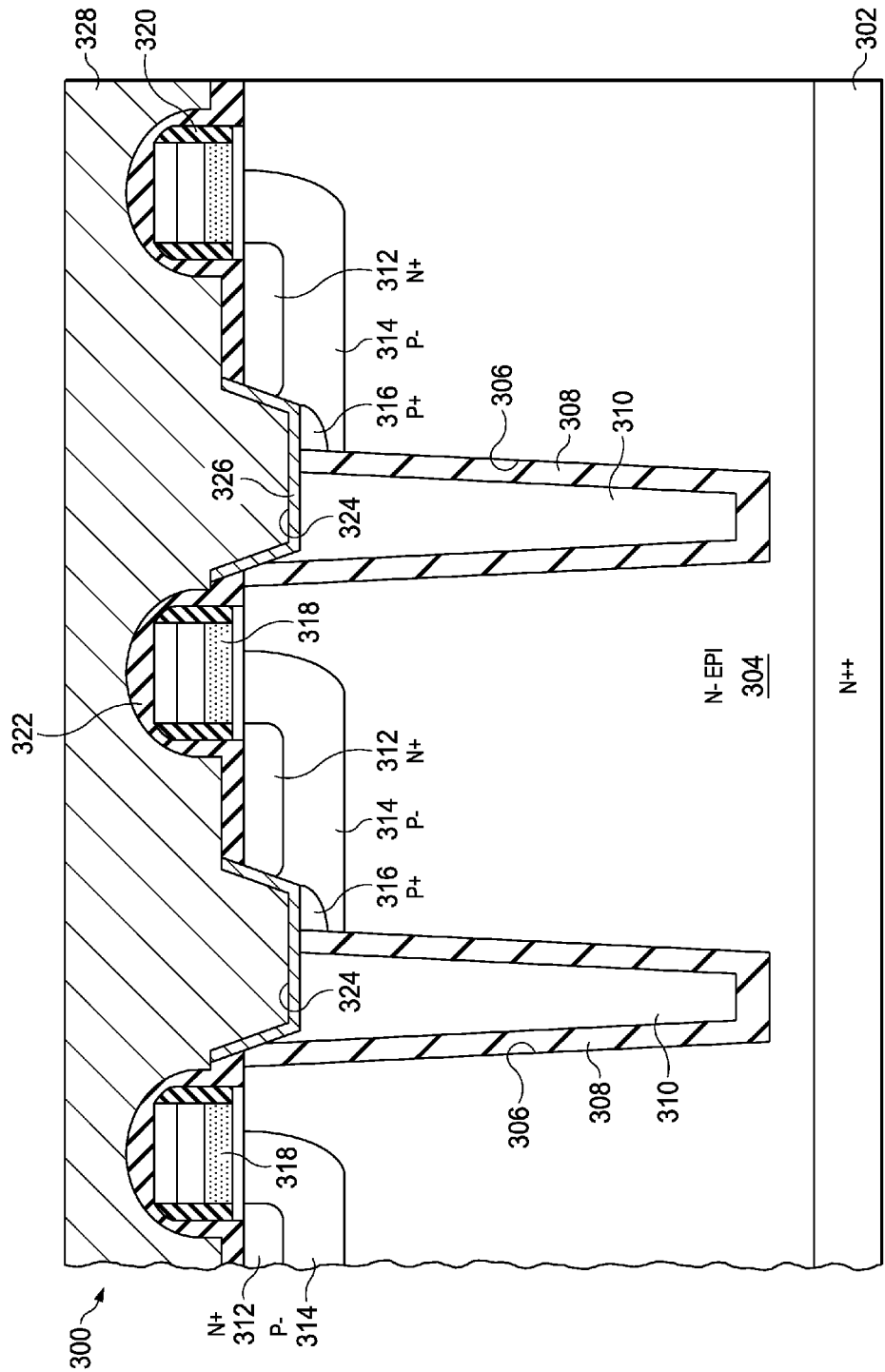
FIG. 3 illustrates the layout of an integrated sense FET for accurate current sensing according to an embodiment of the disclosure.

FIGS. 3-5 depict cross-sections through each of the sensors according to an embodiment of the disclosure. It is noted that the rightmost edge of these figures is at the edge of the chip. FIG. 3 depicts a cross-section through pilot FET 300, which also illustrates the layout of the primary FET, as pilot FET 300 is a scaled down version of the primary FET. In one embodiment, the ratio of primary FET to pilot FET is about 5000:1. Thus, while pilot FET 300 may contain a small number of the cells illustrated in this figure, the primary FET will have many thousands of the same cells. Controller 104 receives the output of pilot FET 300 and, knowing the ratio between primary FET and pilot FET, is thereby enabled to determine the current being carried by the primary FET without drawing from the actual load on the primary FET.

Drain 302 is formed in a heavily doped substrate, which in the present example is N++. It will be understood that the examples disclose an n-type MOSFET, but that a p-type MOSFET can be formed by reversing the doping of the various regions. A lightly doped epitaxial layer 304 forms the drain drift region in which deep trenches 306 are formed. Deep trenches 306 are lined with a liner oxide 308 and filled with a doped polysilicon 310 to create Reduced SURface Field (RESURF) regions that reduce an electric field in an adjacent semiconductor region, e.g., the drain drift region. N+ source regions 312 lie on one side of deep trenches 306 and P− body regions 314 lie adjacent source regions 312. In the disclosed embodiment, P+ region 316 lies adjacent deep trench 306 and below source region 312. P+ region 316 allows for good contact from source contact trenches 324 to P− body region 314. If P+ region 316 does not provide a robust connection to P− body 314 and provide low contact resistance ($R_C$), P-Body 314 is allowed to float, which can allow a parasitic N-P-N bipolar transistor to turn on (source 402 to P-Body 314 to N-Epi 304).

Gates 318, which can be a WSi$_X$/Poly structure, overlies P− body regions 314. Gate 318 has dielectric sidewalls 320 and interlevel dielectric (ILD) 322 covers those surfaces of sense FET 300 that do not receive metal contacts. Source contact trenches 324 are lined with a conductive barrier such as TiN barrier 326 and filled with metal layer 328, which in the disclosed embodiment is aluminum. Source contact trenches 324 laterally contact source regions 312 and also contact polysilicon layer 310 in deep trenches 306. Pilot FET is a fully functioning FET that passes a current from drain 302 to source 312 that is proportional to the current across the power FET.

Figure 4A:
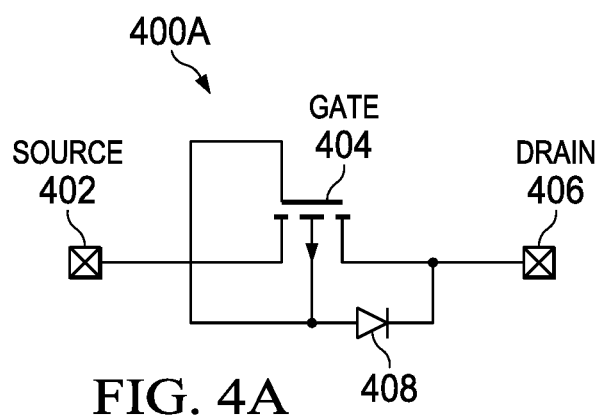
FIG. 4A illustrates a schematic of an integrated temperature sensor according to an embodiment of the disclosure.
Figure 4B:
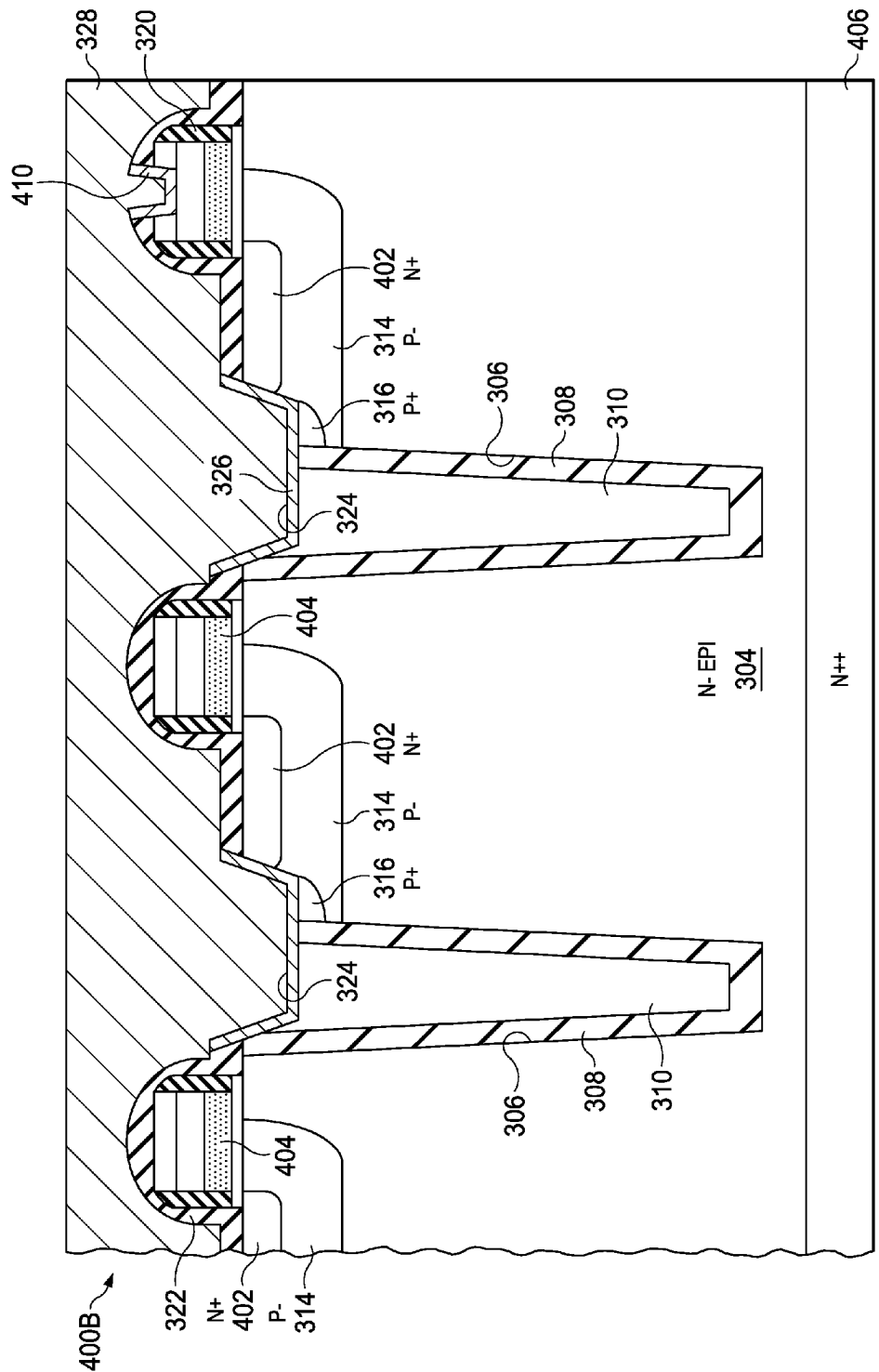
FIG. 4B illustrates the layout of the integrated temperature sensor according to an embodiment of the disclosure.

FIGS. 4A-B illustrate temperature sensor 400 in a schematic (400A) form and in cross-section (400B). It is known that diodes can be used to sense temperature due to the changes in their forward voltage with changes in temperature, with a nearly linear relationship existing between temperature and voltage applied. Rather than creating a true diode in the instant application, Applicant has shorted together source 402 and gate 404 of transistor 400 using source metal tie 410 to connect the two elements. Intrinsic diode 408, which is formed between gate 404 and drain 406, is then used to monitor temperature in power FET 102. It can be seen in layout 400B that temperature sensor 400 is almost identical to pilot FET 300, with the exception of the connection 410 from gate to source. Although not specifically seen in this figure, it will be understood that gates 404 are controlled in common and that contact to a single gate 404 affects all gates 404. Using the body diode thus created, controller 104 is able to receive voltage information via temperature sensor 400 that indicates the temperature of the power FET.

As previously mentioned, although sense FET 300 can be used to detect the load current being drawn from power MOSFET 102, sense FET 300 cannot be used to detect the much higher current fault conditions. Instead, Applicants use another variation on the design of power MOSFET 102 to monitor for current faults.

Figure 5A:
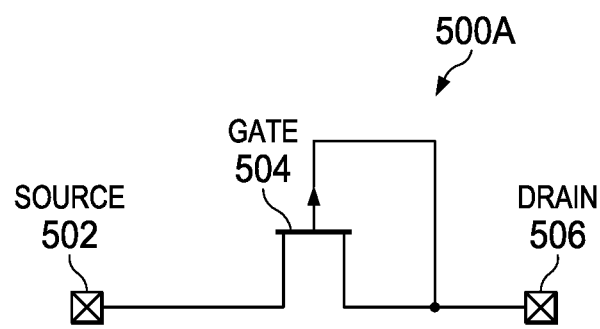
FIG. 5A illustrates a schematic of an integrated high current fault mode sensor according to an embodiment of the disclosure.
Figure 5B:
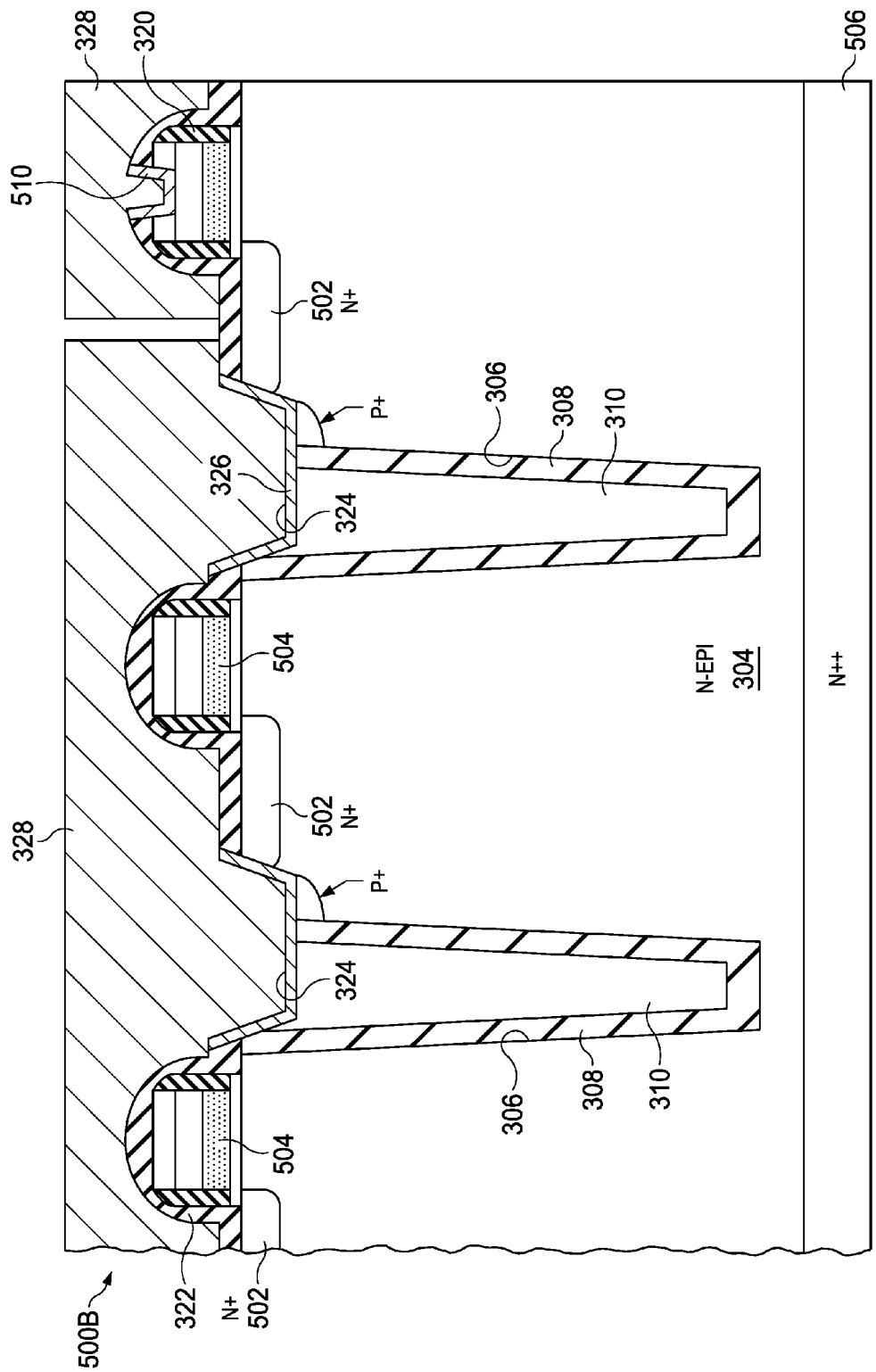
FIG. 5B illustrates the layout of the integrated high current fault mode sensor according to an embodiment of the disclosure.
Figure 5C:
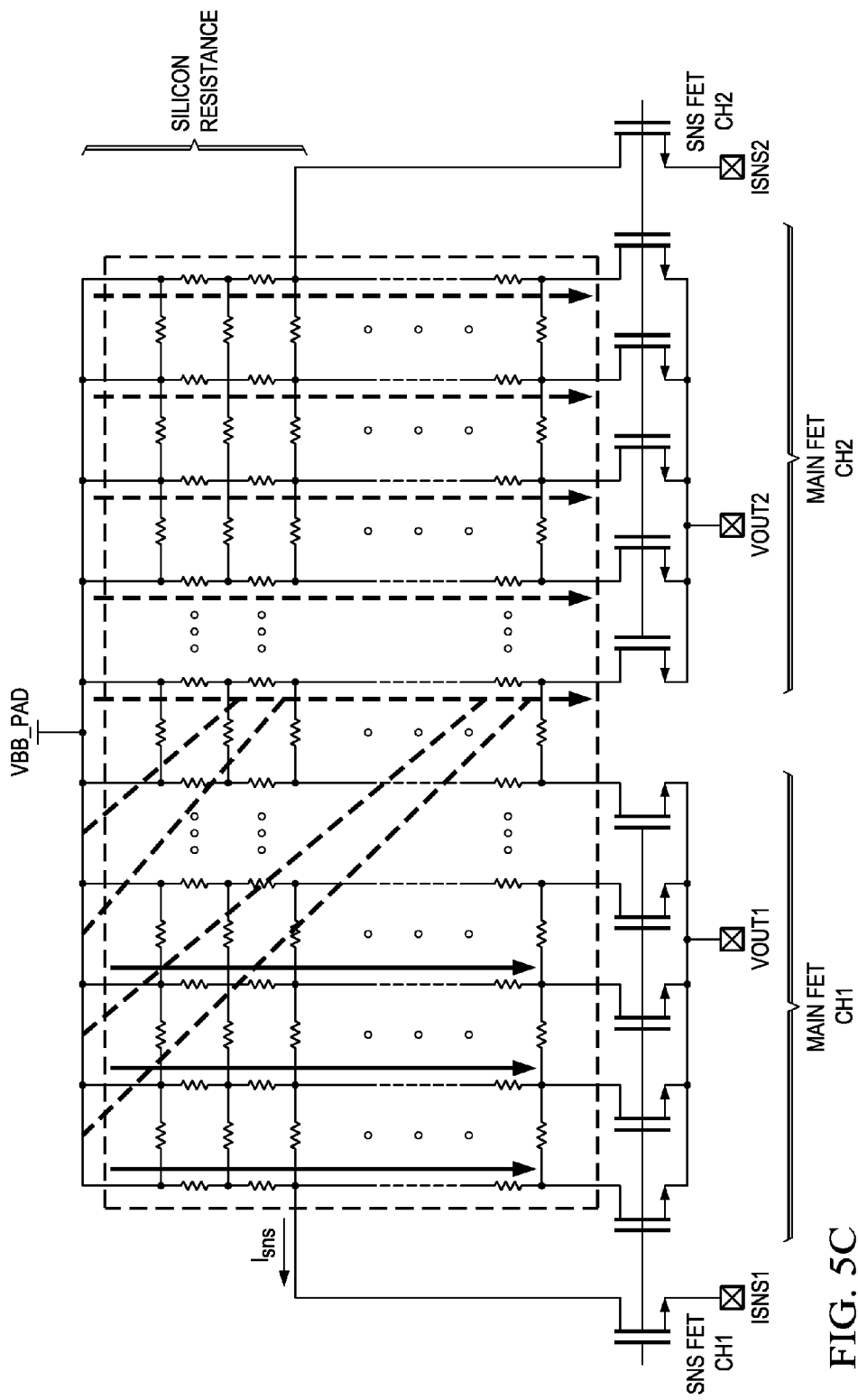
FIG. 5C illustrates the circuit across which the voltage drop is measured by the integrated high current fault mode sensor according to an embodiment of the disclosure.

FIGS. 5A-B illustrate high current fault sensor 500 in both a schematic (500A) form and in cross-section (500B). High current fault sensor 500 differs from sense FET 300 in two ways. First, as seen in schematic 500A, gate 504 and drain 506 of this sensor are shorted together. This short is shown in cross-section 500B as drain metal tie 510. Additionally, it can be seen in cross-section 500B that P– body 314 is missing from high current fault sensor 500. It will be understood that without body 314, high current fault sensor 500 no longer operates as a FET, but can instead be used to determine a voltage drop across the large drain region and its intrinsic resistance. FIG. 5C illustrates that the substrate does not act as a single lumped sense resistor, but includes the three-dimensional silicon substrate (in this application the shared drain substrate of two FETs) as a resistor, across which the voltage drop can be measured. High current fault sensor 500 is thus a Kelvin connection pin that provides drain voltage sensing to controller 104. Since controller 104 will know the resistance across the substrate of the entire FET and can obtain the voltage drop, controller 104 can determine the current in a straightforward manner using V=IR. Using high current fault sensor 500, controller 104 can detect high current fault conditions very quickly and act to turn off FET 102 before any damage can be done.

Figure 6:
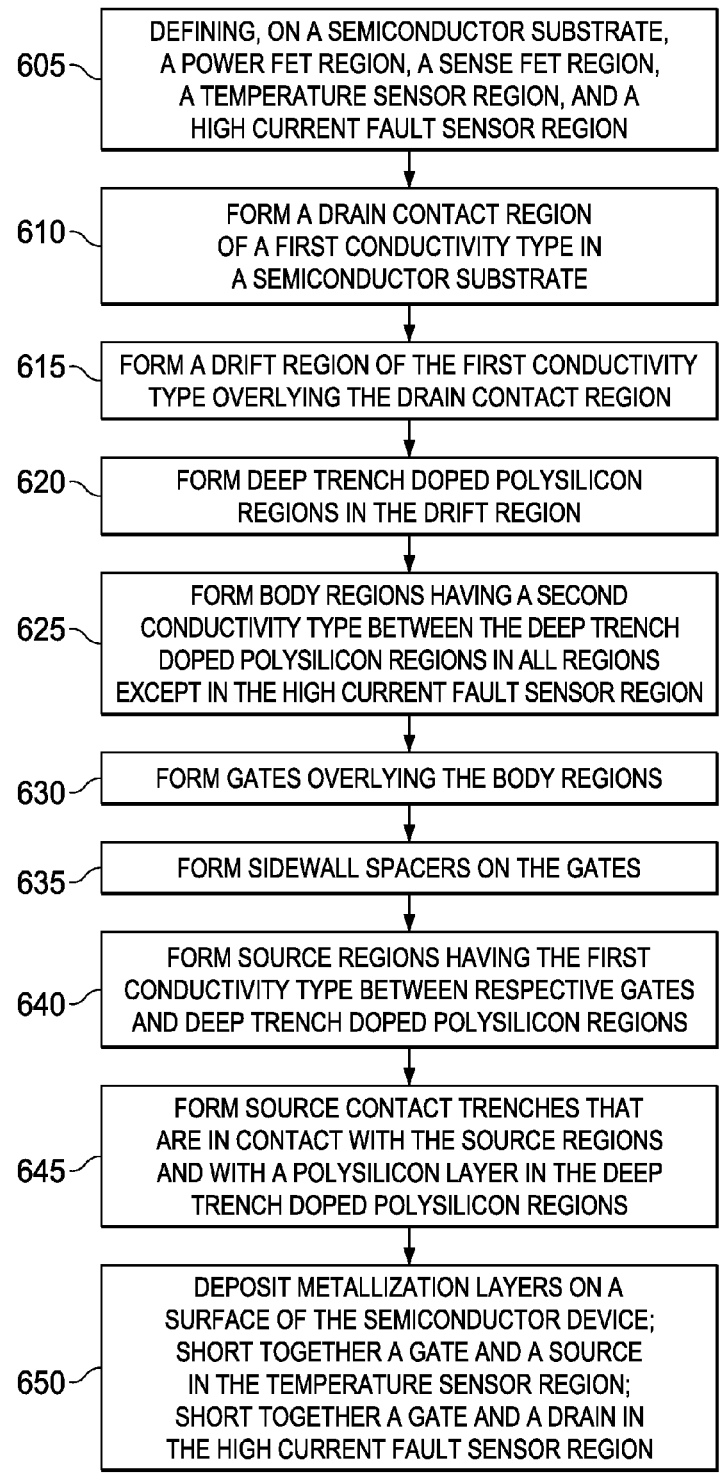
FIG. 6 depicts a method of forming a power FET and sensors according to an embodiment of the disclosure.

A related application, published as US Patent Application Publication No. 2013/0193502, which is incorporated herein by reference, has a somewhat different layout than the present application but uses a similar process to create a power FET. A complete process and illustrations of different stages in the process are provided in Publication 2013/0193502, but a shortened version is provided herein for convenience. FIG. 6 discloses a method of forming the disclosed power MOSFET device having an integrated pilot FET to measure current, an integrated temperature sensor and an integrated high current fault sensor.

The method begins by defining (605), on a semiconductor substrate, a power FET region, a pilot FET region 206, a temperature sensor region 210, and a high current fault region 208. It can be seen from FIG. 2A that the majority of the semiconductor is used as the power FET region, with much smaller areas being defined for the three sensor regions. In one embodiment, the semiconductor substrate is a silicon wafer. A drain contact region 302 is formed (610) in the semiconductor substrate and has a first conductivity type. In an example embodiment, an n-type drain contact region is formed below a top surface of the substrate. The drain contact region may have a doping density of $1 \times 10^{18}/\text{cm}^3$ to $1 \times 10^{21}/\text{cm}^3$ and may be formed by an ion implant process or a furnace diffusion process at an existing top surface of the substrate.

A drift region 304 is formed (615) overlying the drain contact region and extending to the top surface of the substrate, the drift region also has the first conductivity type, e.g., N-type. The drift region may be formed by epitaxial growth of semiconductor material on the drain contact region. The thickness and doping density of the drift region may depend on an operating voltage of the MOSFET. Table 1 below provides example parameters for a drift region designed for different conditions:

TABLE 1

| Operating voltage (V) | Drift region thickness (microns) | Doping density/cm$^3$ |
| --- | --- | --- |
| 30 | 4 | $5 \times 10^{16}$-$1 \times 10^{17}$ |
| 60 | 7 | $1 \times 10^{16}$-$5 \times 10^{16}$ |
| 100 | 10 | $1 \times 10^{16}$-$5 \times 10^{16}$ |
| 200 | 20 | $1 \times 10^{16}$-$5 \times 10^{16}$ |

Doping in the drift region may be formed by in-situ doping during epitaxial growth or by ion implant and subsequent diffusion during a thermal drive operation.

The method next forms (620) deep trench doped polysilicon regions 306 in the drift region, which can form RESURF regions. This process may include forming a trench etch hard mask over the substrate, e.g., by forming a layer of dielectric material over the substrate and patterning the layer of dielectric material using a photoresist etch mask. The trench etch hard mask may include 20 to 30 nanometers of thermally grown silicon dioxide and 200 to 300 nanometers of deposited silicon dioxide. The trench etch hard mask may be patterned using a reactive ion etch (RIE) process or using a wet etch of buffered aqueous hydrofluoric acid. The deep trench doped polysilicon regions are formed in the drift region by removing epitaxial material in areas exposed by the trench etch hard mask. The deep trench doped polysilicon regions may be 0.6 to 1.5 microns wide, and separated by 1.5 to 3.5 microns. Bottoms of the doped polysilicon trenches may be, e.g., a half micron to a micron above the drain contact region. The deep trench doped polysilicon regions may be formed using an RIE process which forms polymers on sidewalls of trenches while etching bottoms of the trenches, so as to maintain a nearly constant trench width. The trench etch hard mask may be subsequently removed.

A trench liner of dielectric material 308 is formed in the deep trench doped polysilicon regions and may also extend over a top surface of the substrate. The trench liner may include, for example, 50 nanometers of thermally grown silicon dioxide contacting the substrate and 200 nanometers of deposited silicon dioxide using a chemical vapor deposition (CVD) process, for a medium voltage MOSFET designed to operate at 30 volts. A medium voltage MOSFET designed to operate at 200 volts may have a trench liner with 150 nanometers of thermally grown silicon dioxide contacting the substrate and 800 nanometers of CVD silicon dioxide.

The deep trench doped polysilicon regions are then filled with a conductive material. In one embodiment, this conductive material is polysilicon 310, formed by thermally decomposing silane gas inside a low-pressure reactor at a temperature between 580-650° C. in the deep trench doped polysilicon regions. Alternatively, the conductive material may include amorphous silicon, formed by thermally decomposing silane gas inside a low-pressure reactor at a temperature below 580°. N-type dopants, such as phosphorus, or p-type dopants, such as boron, are implanted into the polysilicon at a dose of $8 \times 10^{14}/cm^2$ to $1 \times 10^{16}/cm^2$. A thermal drive operation diffuses the dopants into the polysilicon in the deep trench doped polysilicon regions. Alternately, the polysilicon may be doped to a desired level during formation using appropriate dopant reagents. Unwanted polysilicon may subsequently be removed from a top surface of the trench liner deep trench doped polysilicon regions with top surfaces approximately coplanar with, or slightly lower than, the top surface of the substrate.

Once the deep trench doped polysilicon regions are formed, the method forms (625) body regions 314 in all regions except in the high current fault sensor region. In one embodiment, a body implant mask is formed to expose regions between the gates and the deep trench doped polysilicon regions. In the example embodiment, P-type dopants such as boron are implanted at a dose of $3 \times 10^{13}/cm^2$ to $2 \times 10^{14}/cm^2$ into the substrate adjacent to the deep trench doped polysilicon regions to form a body implanted region. The body implant mask is removed after the p-type dopants are implanted and may use an oxygen ash followed by a wet cleanup with an aqueous mixture of hydrogen peroxide and sulfuric acid. A thermal drive process diffuses and activates the p-type dopants in the body implanted region to form a body region. The thermal drive process may include heating the substrate at 1100° C. for 90 minutes or equivalent conditions, for example, 1125° C. for 50 minutes, or 1050° C. for 270 minutes.

The method then forms (630) gates 318 overlying the body regions. Notably, although body regions have not been formed in the high current fault sensor region, gates are formed in this region and overlie the region in which the body regions would normally have been placed. In one embodiment, forming the gates includes forming a gate dielectric layer on the top surface of the substrate. A cleanup etch, which may be a wet etch using dilute hydrofluoric acid, may be performed prior to forming the gate dielectric layer to remove any unwanted oxide on the substrate. The gate dielectric layer may be 80 to 85 nanometers of thermally grown silicon dioxide for a medium voltage MOSFET designed to operate at 30 volts, to 540-560 nanometers for a medium voltage MOSFET designed to operate at 200 volts. The gate dielectric layer may include one or more layers of other dielectric material such as silicon oxynitride or hafnium oxide.

Formation of the gate continues with forming a layer of gate material over the gate dielectric layer. The layer of gate material may include 100 to 200 nanometers of polysilicon and may also include a layer of metal silicide on the polysilicon, such as 100 to 200 nanometers of tungsten silicide. Other materials for the layer of gate material are within the scope of the disclosed method. A layer of cap dielectric may be formed over the layer of gate material. The layer of cap dielectric may include 50 to 150 nanometers of silicon dioxide formed by a plasma-enhanced chemical vapor deposition (PECVD) process. A gate etch mask is formed over the layer of cap dielectric; the gate etch mask may include photoresist, an anti-reflection layer and/or a hard mask layer. A gate etch process removes unwanted material from the layer of gate material to form gates as shown in the figures.

Sidewall spacers 318 are then formed (635) on the gates. The sidewall spacers may be formed by forming a conformal layer of silicon dioxide 50 to 100 nanometers thick over an existing top surface of the semiconductor device and removing the silicon dioxide from horizontal surfaces using an anisotropic etch process such as an RIE process.

Source regions 312 having the first conductivity type are formed (640) between respective gates and deep trench doped polysilicon regions. Formation of the source regions may begin with forming a screen oxide layer with a stress less than 100 megapascals (MPa) over an existing top surface of the semiconductor device. The screen oxide layer may include 10-30 nanometers of silicon dioxide, formed using a PECVD process or a low pressure chemical vapor deposition (LPCVD) process.

A source implant mask is formed on the semiconductor device and a source implant process implants n-type dopants such as phosphorus and/or arsenic into the substrate between respective gates and deep trench doped polysilicon regions to form source implanted regions. The source implant process may include implanting arsenic at a dose of $8 \times 10^{14}/cm^2$ to $1 \times 10^{16}/cm^2$ and energy of 20-70 keV. Subsequently, the source implant mask is removed. The n-type dopants in the source implanted regions are diffused and activated by a source anneal operation, to form n-type source regions. The source regions extend under the gate sidewall spacers. The source anneal operation may include heating the substrate at 1000° C. for 20 minutes in a nitrogen ambient or equivalent anneal conditions, for example, 1050° C. for 5 minutes, or 975° C. for 40 minutes.

Source contact trenches 324 are formed (645). These source contact trenches are in contact with the source regions and with the polysilicon layer in the deep trench doped polysilicon regions. An interlevel dielectric (ILD) layer is formed over an existing top surface of the semiconductor device. The ILD may include 70-200 nanometers of silicon dioxide, formed for example using a PECVD process. A source-contact etch mask is formed over the ILD. In one embodiment, the source-contact etch mask exposes regions along the deep trench doped polysilicon regions and portions of the substrate immediately abutting the deep trench doped polysilicon regions. A source contact etch process removes material from the ILD, the substrate, the trench liner and the deep trench doped polysilicon region to form source-contact trenches. The source-contact trenches extend 200-400 nanometers below the top surface of the substrate and expose the source regions on a side of the source-contact trenches and expose the deep trench doped polysilicon regions on bottoms of the source-contact trenches. Forming the source-contact trenches to expose the source region and the deep trench doped polysilicon regions advantageously reduces the area required for the MOSFET. P+ region 316 is implanted after the source contact etch allowing for a low resistance contact to P-body 314.

Metallization layers 328 are deposited (650) on the surface of the semiconductor device to form a contact metal stack. The contact metallization process may start with formation of a titanium liner on an existing top surface of the semiconductor device, contacting the source regions and the deep trench doped polysilicon regions. The titanium liner may be 25 to 50 nanometers thick, formed by a sputter process. A first titanium nitride layer is formed on the titanium layer using a reactive sputter process. The first titanium nitride layer 180 may be 15 to 30 nanometers thick. The titanium layer and the first titanium nitride layer are heated, for example to 700-740° C. for 20 to 60 seconds, to form ohmic contacts to the source regions and the deep trench doped polysilicon regions.

A second titanium nitride layer, 8 to 15 nanometers thick, is formed on the first titanium nitride layer using a CVD process to provide a conformal layer. A third titanium nitride layer, 15 to 30 nanometers thick, is formed on the second titanium nitride layer using a reactive sputtering process. A source metal layer, which in one embodiment is 2 to 5 microns of sputtered aluminum, is formed on the contact metal stack. The source metal layer and the contact metal stack are patterned, e.g., using an etch mask and reactive ion etch process. These combined metallization layers short together a gate and a source in the temperature sensor region and also short together a gate and a drain in the high current fault sensor region.

The disclosed embodiments use only variations on the intrinsic FET, with no other additional components and may provide one or more of the following:

A temperature sensor local to the power FET using a body diode of the FET to obtain true peak temperature information;

High current fault detection using vertical drain resistance as a sensor;

Accurate current sensing current; and

A small solution size using common drain structure to support dual channel mode with very low on resistance, e.g., 8 mΩ.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A semiconductor device comprising:
    a substrate comprising a semiconductor;
    a power field effect transistor (FET);
    an integrated sense FET that measures a first current that is proportional to a load current on said FET;
    an integrated high current fault sensor that measures a voltage across a drain of said power FET; and
    an integrated temperature sensor that measures a voltage that is proportional to a temperature of said power FET;
    wherein said power FET has a first structure that comprises:
        a drain contact region of a first conductivity type disposed in said substrate;
        a drain drift region of said first conductivity type disposed over said drain contact region;
        doped polysilicon trenches disposed in said drain drift region;
        a body region of a second conductivity type, opposite from said first conductivity type, disposed between said doped polysilicon trenches;
        a source region disposed on a lateral side of said doped polysilicon trenches and in contact with said body region; and
        a source contact trench that makes contact with said source region and with said doped polysilicon trenches.

2. The semiconductor device as recited in claim 1 wherein said integrated high current fault sensor comprises said first structure without said body region and further wherein a gate of said high current fault sensor is shorted to said drain contact region.

3. The semiconductor device as recited in claim 2 wherein said integrated temperature sensor comprises said first structure and further wherein a gate of said integrated temperature sensor and a source region of said integrated temperature sensor are shorted together.

4. The semiconductor device as recited in claim 3 wherein said integrated sense FET has said first structure and a size that is a fraction of a size of said power FET.

5. The semiconductor device as recited in claim 4 wherein impedance across said power FET is approximately 8 milliohms.

6. The semiconductor device as recited in claim 5 wherein said doped polysilicon trenches comprise deep trenches lined with a dielectric and filled with polysilicon having said second conductivity type.

7. The semiconductor device as recited in claim 6 further comprising a heavily-doped region of said second conductivity type, said heavily-doped region lying adjacent said doped polysilicon trenches and being contacted by said source contact trench.

8. The semiconductor device as recited in claim 1 wherein said first conductivity type is N-type and said second conductivity type is P-type.

9. A method of forming a semiconductor device, comprising:
    defining, on a semiconductor substrate, a power field effect transistor (FET) region, a sense FET region, a temperature sensor region, and a high current fault sensor region;
    forming a drain contact region of a first conductivity type in the semiconductor substrate and forming a drift region of said first conductivity type overlying said drain contact region;
    forming deep trench doped polysilicon regions in said drift region;
    forming body regions in all regions except said high current fault region, said body regions lying between said deep trench doped polysilicon regions;
    forming gates overlying said body regions;
    forming sidewall spacers on said gates;
    forming source regions of said first conductivity type between respective gates and deep trench doped polysilicon regions; and
    forming source contact trenches that are in contact with said source regions and with a polysilicon layer in said deep trench doped polysilicon regions and depositing metallization layers on a surface of said semiconductor device, wherein a gate and a source in said temperature sensor region are shorted together and further wherein a gate and a drain in said high current fault sensor region are shorted together.

10. The method of forming a semiconductor device as recited in claim 9 wherein forming said deep trench doped polysilicon regions comprises forming a dielectric layer that lines the surface of said deep trench doped polysilicon regions and forming a doped polysilicon layer that fills said deep trench doped polysilicon regions.

11. The method of forming a semiconductor device as recited in claim 10 wherein forming said doped polysilicon layer comprises implanting dopants into said deep trench doped polysilicon regions and performing a thermal drive process to diffuse said dopants through said deep trench doped polysilicon regions.

12. The method of forming a semiconductor device as recited in claim 10 wherein forming said respective body regions comprises forming a body implant mask on said semiconductor device, implanting dopants in said drift region at a dose between $3\times10^{13}/cm^2$ and $2\times10^{14}/cm^2$, and performing a thermal drive process.

13. The method of forming a semiconductor device as recited in claim 12 wherein forming said gates comprises forming a gate dielectric layer on a surface of said semiconductor, forming a layer of polysilicon overlying said gate dielectric layer, forming a cap dielectric layer overlying said layer of polysilicon, forming a gate etch mask and etching said semiconductor device to remove unwanted material.

14. The method of forming a semiconductor device as recited in claim 13 wherein forming said respective source regions comprises forming a source implant mask on said semiconductor device, implanting dopants in said drift region at a dose between $8\times10^{14}/cm^2$ and $1\times10^{16}/cm^2$, and performing a thermal drive process.

15. The method of forming a semiconductor device as recited in claim 14 wherein forming said source contact trenches comprises forming an interlevel dielectric layer over an existing top surface of the semiconductor device, forming a source-contact etch mask over the interlevel dielectric, and etching source contact trenches to a depth between 200-400 nanometers below the top surface of the semiconductor wafer.

16. The method of forming a semiconductor device as recited in claim 15 wherein forming said source contact trenches further comprises forming a titanium liner on the existing top surface of said semiconductor device and forming a source metal layer over said titanium liner.

* * * * *